(12) United States Patent
Kuibira et al.

(10) Patent No.: US 7,145,106 B2
(45) Date of Patent: *Dec. 5, 2006

(54) HEATER MODULE FOR SEMICONDUCTOR MANUFACTURING EQUIPMENT

(75) Inventors: Akira Kuibira, Itami (JP); Hirohiko Nakata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/160,856

(22) Filed: Jul. 13, 2005

(65) Prior Publication Data

US 2005/0242079 A1  Nov. 3, 2005

Related U.S. Application Data

(63) Continuation of application No. 10/487,842, filed on Feb. 23, 2004, now Pat. No. 6,963,052.

(30) Foreign Application Priority Data

Jun. 5, 2002  (JP) .............................. 2002-163747

(51) Int. Cl.
*H05B 3/68* (2006.01)
*C23C 16/00* (2006.01)

(52) U.S. Cl. .................................. 219/444.1; 118/724

(58) Field of Classification Search ............. 219/443.1, 219/444.1, 513–548; 118/724–729, 723 VE
See application file for complete search history.

(56) References Cited

U.S. PATENT DOCUMENTS

| 5,140,895 A | * | 8/1992 | Imanishi ...................... 91/361 |
| 6,072,163 A | * | 6/2000 | Armstrong et al. ......... 219/497 |
| 6,963,052 B1 | * | 11/2005 | Kuibira et al. ........... 219/444.1 |

FOREIGN PATENT DOCUMENTS

| CN | 1297670 A | 5/2005 |
| JP | H07-037708 A | 2/1990 |
| JP | 2000-164601 A | 6/2000 |

* cited by examiner

*Primary Examiner*—Sang Paik
(74) *Attorney, Agent, or Firm*—James Judge

(57) ABSTRACT

Heater module, and semiconductor manufacturing equipment in which the heater module is utilized, for raising the cooling speed of a post-heating heater markedly more than conventional, and that can contribute toward bettering and improving productivity, without accompanying scaling-up of and cost increases in the semiconductor manufacturing equipment. The heater module is furnished with heater part 1*a* for controlled heating of a wafer placed on its top face, and block part 3*a* provided to be shiftable relative to said heater part, for varying heat capacity in total with heater part 1*a* by abutting on or separating from the reverse surface of heater part 1*a*. By having the heat capacity of block part 3*a* be 20% or more of the total heat capacity of heater part 1*a* and block part 3*a*, the heater cooling speed can be made 10° C./min or more.

20 Claims, 3 Drawing Sheets

HEATER MODULE FOR SEMICONDUCTOR MANUFACTURING EQUIPMENT

BACKGROUND OF THE INVENTION

1. Technical Field

The present invention relates to heater modules, utilized in semiconductor manufacturing tools that process semiconductor wafers, for semiconductor manufacturing equipment capable of heat-treating and cooling wafers, and to semiconductor manufacturing equipment in which such heater modules are installed.

2. Background Art

In the course of semiconductor fabrication, processes in which after being treated by heating wafers are cooled include: thermosetting of photoresists in photolithography with coater/developers; heating/baking of low-dielectric-constant, i.e. low-k, insulating films; CVD film deposition in forming metal interconnects and dielectric layers; and processes in etchers.

Heat-treatment of the wafers in these processes has conventionally been carried out using heaters made of aluminum or ceramic. In particular, wafers are placed onto the outer face of heaters in which a heating element is formed, utilized to control heating while the wafers undergo processes such as thermosetting of photoresists and heating/baking of low-k films, or CVD film deposition and etching.

Recently, in order to enhance productivity in these processes, it has become necessary to raise cooling speed for the post-heating heaters. By the same token, designing for rapid cooling of the processed articles to improve their characteristics has become widespread, and in particular, accompanying the enlarging of wafer diametric span demands for enhanced cooling speed have been growing.

Forcible liquid cooling and air cooling have been adopted in order to rapidly cool the heater in semiconductor manufacturing equipment applications to date. In specific terms, a cooling block is installed on the heater, usually on the reverse side, and by circulating through the block a liquid or air as a heat-transferring medium for cooling, heat is carried away from the heater, heightening the cooling speed.

Nevertheless, with these forcible liquid cooling and air cooling systems, the fact that large-scale devices are necessary for circulating the heat-transferring medium and for radiating heat has proved to be a cost-increasing factor in semiconductor manufacturing. Likewise, with it not being possible to enlarge the capacity for the heat-transferring medium within the limited space of the heater, significant improvement in heater cooling speed has been difficult.

BRIEF SUMMARY OF THE INVENTION

An object of the present invention, in view of such circumstances to date, is to render a heater module, and semiconductor manufacturing equipment in which the heater module is utilized, that makes it possible to raise markedly the cooling speed of a post-heating heater, and that contributes toward bettering and improving productivity, without accompanying scaling-up of and cost increases in the semiconductor manufacturing equipment.

In order to achieve the foregoing objective, for semiconductor manufacturing equipment a heater module that the present invention renders is characterized in being provided with a heater part for controlled heating of a wafer placed on its outer face, and a block part furnished to be shiftable relative to the heater part, for varying heat capacity in total with the heater part by abutting on and separating from the reverse side of the heater part. In particular, the heat capacity of the block part is 20% or more of the total heat capacity of the heater part and the block part.

An advantage of the foregoing heater module of the present invention for semiconductor manufacturing equipment is in a first aspect that during heating the heater part and the block part are brought into abutment, and during cooling, by the block part being relatively shift-separated from the heater part, the cooling speed of the heater part is quickened. Another advantage is in a second aspect that during heating the heater part and the block part are separated, and during cooling, by the block part and the heater part being shifted relatively into abutment to conduct heat into the block part, the cooling speed of the heater part is quickened.

With the foregoing heater module of the present invention for semiconductor manufacturing equipment, when the heater part and the block part are in abutment, the block part is preferably fixed to the heater part by vacuum-chucking it thereto. In addition, at least one of either of the abutment surfaces along which the heater part and the block part abut on each other preferably is a specular surface.

Furthermore, with the foregoing heater module of the present invention for semiconductor manufacturing equipment, the block part may be affixed to the chamber bottom part in the semiconductor manufacturing equipment, or else may be shifted into abutment on the chamber bottom part. In that case, the chamber bottom part preferably is water-cooled.

In the foregoing heater module of the present invention for semiconductor manufacturing equipment, the heater part preferably is a ceramic in which a heating element is formed. The ceramic is preferably at least one selected from the group consisting of aluminum oxide, aluminum nitride, silicon nitride, silicon carbide, and boron nitride.

In addition, in the foregoing heater module of the present invention for semiconductor manufacturing equipment, the block part is preferably at least one selected from the group consisting of aluminum, magnesium, copper, iron, stainless steel, aluminum oxide, aluminum nitride, silicon nitride, silicon carbide, and boron nitride.

The foregoing heater module of the present invention for semiconductor manufacturing equipment is preferably utilized in CVD equipment, etcher equipment, coater/developer equipment, or a low-k dielectric baking device.

Furthermore, the present invention renders semiconductor manufacturing equipment characterized in that installed therein is an above-described heater module of the present invention for semiconductor manufacturing equipment.

DETAILED DESCRIPTION OF THE INVENTION

When a heater that has been heated is being cooled, its heat capacity is what affects the cooling speed. The larger the heat capacity of the heater is, the slower the cooling speed will be; conversely, the smaller the heat capacity is, the faster the cooling speed will be. Conceivable as a means of lessening the heat capacity of the heater with the objective of raising the cooling speed would be thinning the heater thickness.

Meanwhile, wafers must be heated uniformly, and owing to the consequent demand that the wafer-carrying surface of the heater be highly isothermal, exploiting the thickness of the heater to spread the heat generated by heating element uniformly in all directions is desirable. Still, thinning the thickness of a heater in order to heighten its cooling speed gives rise to problems in that its effectiveness in spreading heat uniformly is reduced, and the isothermal properties in the wafer-carrying surface of the heater are harmed.

To address this situation, the present invention provides a heater part for controlled heating of a wafer placed on its outer face and, shiftable relative to the heater part, a block part that may be abutted on as well as separated from the reverse side of the heater part. With a heater module configured in this way by the heater part and block part, the total heat capacity of the heater part and the block part may be changed by the block part being in abutment against, and with it being separated from, the reverse side of the heater part, and exploiting this varying of the total heat capacity enables bettering and enhancing both the isothermal properties, and at the same time the cooling speed, of the heater.

In particular, having the heat capacity of the block part be 20% or more of the total heat capacity of the heater part and the block part makes even more heat be transmitted from the heater to the block part being in abutment on the heater, or else enables even more heat to be diffused to the surroundings from the heater being parted off the block part, on account of which cooling speeds that are all the higher may be looked forward to. It will be appreciated that the larger the heat capacity of the block part, the more the cooling speed of the heater part may be boosted. Nevertheless, inasmusch as enlarging the heat capacity of the block part means that the chamber—and the equipment as a whole—must be enlarged as well, the heat capacity of the block part must be planned taking into consideration the goal of cooling speed enhancement and the economics of the equipment overall.

Figure 1A:
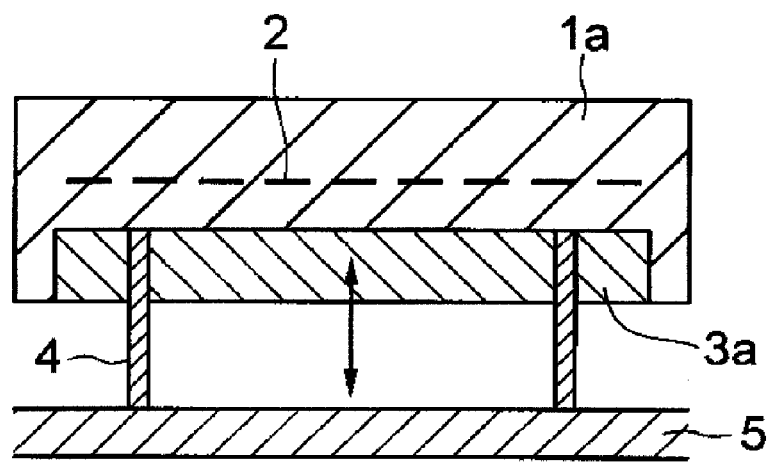
FIG. 1 is a schematic sectional view illustrating one specific example of a heater module in a first aspect of the present invention.

One specific example of a first aspect of the present invention in a heater module is depicted in FIG. 1. The heater module is furnished with heater part 1a in the interior of which a heating element 2 is formed, and block part 3a provided at the reverse side of heater part 1a to be shiftable up and down along guide shafts 4, wherein during heating heater part 1a and block part 3a are in abutment, as indicated in FIG. 1(a).

Figure 1B:
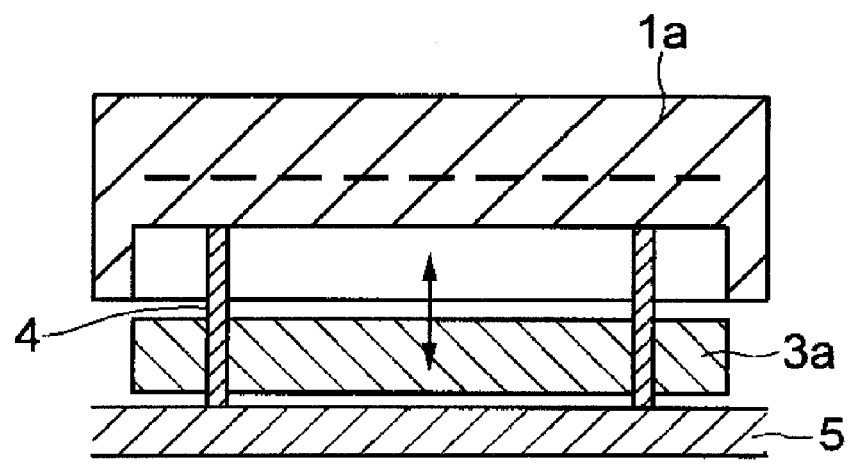

When the heater module is to heat, heater part 1a and block part 3a are united to form a large-heat-capacity heater; and when it is to be cooled, block part 3a is, as depicted in FIG. 1(b), parted away from heater part 1a, descending toward the bottom part 5 of the equipment chamber. Accordingly, heat radiation is promoted, and the cooling speed of heater part 1a is hastened, by the fact that heater part 1a is left on its own with a smaller heat capacity.

Figure 2A:
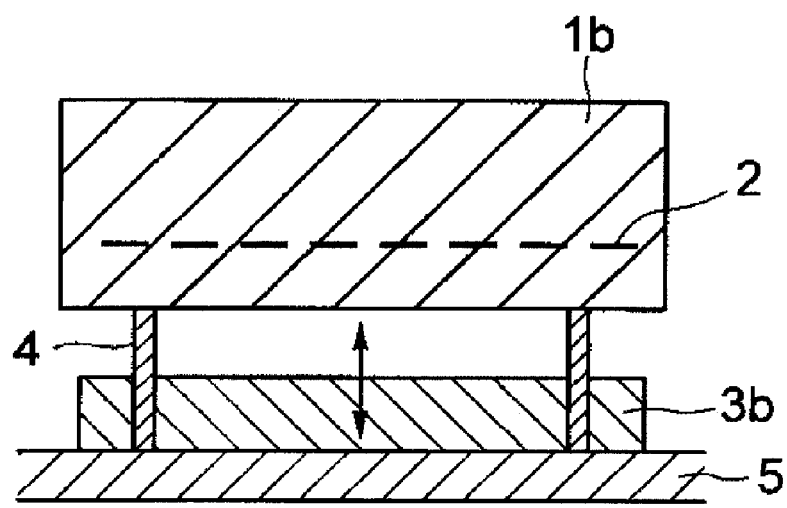
FIG. 2 is a schematic sectional view illustrating one specific example of a heater module in a second aspect of the present invention.
Figure 2B:
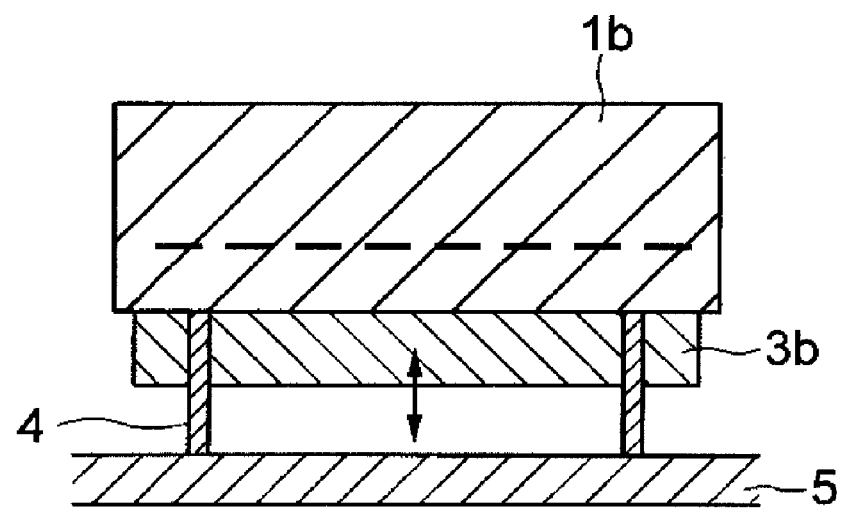

Likewise, in the specific instance illustrated in FIG. 2 for example, as the heater module in a second aspect, heater part 1b and block part 3b as shown in FIG. 2(a) are separated during heating, and during cooling block part 3b is, as indicated in FIG. 2(b), elevated to abut on the reverse side of heater part 1b, which is stationary. The abutting of block part 3b lets the cooling speed of heater part 1b be sped, because the heat in heater part 1b is transmitted to block part 3b, which has individuated heat capacity.

Figure 3A:
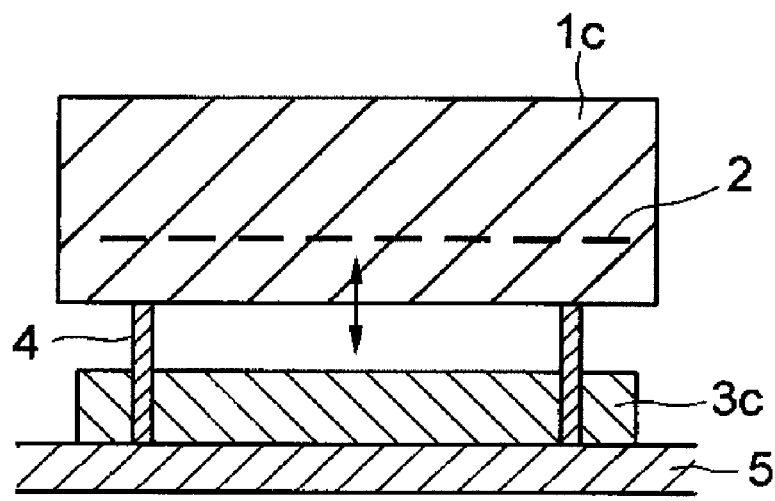
FIG. 3 is a schematic sectional view illustrating a separate specific example of a heater module in the second aspect of the present invention.
Figure 3B:
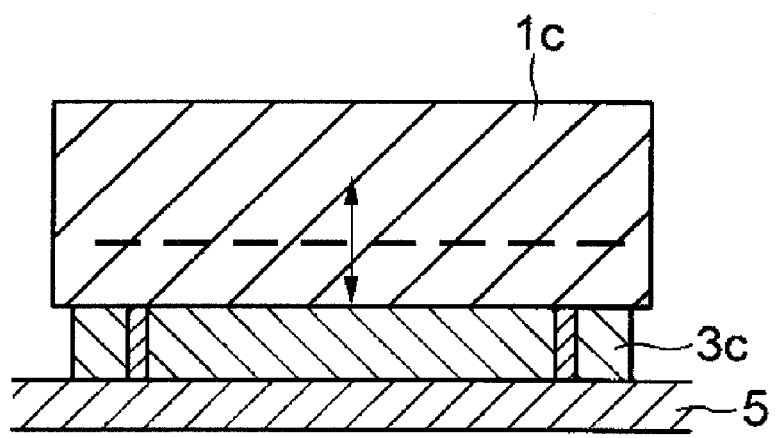

In a heater module depicted in FIG. 3, further in the second aspect of the present invention, block part 3c is stationary and heater part 1c shifts up and down along the guide shafts 4, apart from which the heater module is the same as that of FIG. 2. In particular, during heating, heater part 1c and block part 3c are as shown in FIG. 3(a) separated, and during cooling, by bringing down heater part 1c to abut on block part 3c on the bottom part 5 of the chamber, as indicated in FIG. 3(b), the heat in heater part 1c is transmitted to block part 3c.

Factors influencing the transmission of heat from the heater part to the block part include contact resistance in the surfaces along which the heater part and block part abut. If the contact resistance is large, the isothermal properties and cooling speed of the heater part are liable to be affected because it takes time for heat to pass from the heater part. In light of this fact, forming through-holes in the top face of the block part or in the reverse face of the heater part and vacuum—chucking the two together under suction with a vacuum pump lets the abutment surfaces of the heater part and the block part adhere closely, dramatically lowering the contact resistance, which therefore is advantageous in improving the cooling speed of the heater part especially in the heater module in the second aspect.

Furthermore, with the heater module in the second aspect in particular, the block part separated from the heater part during heating is liable to be heated by radiant heat from the heater part. Given this situation, processing either or both of the matching abutment surfaces of the heater part and the block part into a specular surface makes reflecting back radiant heat from the heater part possible. As a result, the clearance between the heater part and the block part when heating is underway can be made smaller, which makes scaling-down the chamber as well as the equipment possible.

What is more, if the heat that is transmitted to the block part is retained as such, improvement in the cooling speed of the heater part could not be expected because the heat that is transmitted from the heater part when cooling is next underway would be kept from being adequately absorbed. For that reason, it is preferable that after the block part undergoes transmission of heat in contact with the heater part it is parted from the heater part and brought into contact with the bottom part of the chamber to send its heat into the chamber bottom part, whereby the block part cools quickly, readying it for the next cooling. In that case, time to make ready for the next cooling may be shortened by water-cooling the chamber bottom part.

Here, it is preferable to employ oil pressure or air pressure in abutting as well as separating the heater part and block part, because doing so lets the heater part as well as the block part be shifted smoothly.

The heater part in the present invention may be either a metal such as aluminum or a ceramic, but is preferably a ceramic in which a heating element is formed. Preferable as the ceramic constituting the heater part is at least one selected from the group consisting of aluminum oxide, aluminum nitride, silicon nitride, silicon carbide, and boron nitride.

Because both thermal and mechanical shock is exerted on the boundary surface of the heater part in abutting with the block part, the chances are high that cracking and like troubles will arise in the heater part with it being ceramic. Owing to this likelihood, such shock can be mitigated by covering with metal a surface of the heater part made from ceramic—at least the face that abuts with the block part—to prevent cracking or the like in the heater part.

Meanwhile, metal or ceramic whose thermal conductivity is high may be utilized for the block part; preferable are, for example, Al, Mg, Cu, Fe, stainless steel, aluminum oxide, aluminum nitride, silicon nitride, silicon carbide, and boron nitride.

It is also preferable that the block part is either identical or similar to the heater part in form, and in that its diameter is within ±25% of the diameter of the heater part. And it will be appreciated that as stated above, the heat capacity of the block part preferably is 20% or more of the total heat capacity of the heater part and the block part.

The cooling speed of conventional heaters has generally been at the 1° C./min level, because it has been dependent solely on radiant heat from a heater having a certain heat capacity. In contrast, in a heater module as defined by the present invention the cooling speed of the heater part, although it depends on the heat capacity of the block part, is enhanced to at least several times the conventional level. Specifically, cooling speeds of 10° C./min or more can be achieved if the heat capacity of the block part is designed to be 20% or more of the total heat capacity of the heater part and the block part, enabling productivity to be dramatically improved. What is more, such improvement in cooling speed means that in terms of wafers, enhancement in the adhesive strength of thin films, enhancement in mechanical hardness, and enhancement in etching characteristics can be anticipated.

Another consideration is that in situations where a heater is cooled by heat radiation, with cooling speed being influenced by surface area, the temperature in the vicinity of the heater lateral side has a greater tendency to drop because the surface area there is generally large compared with the middle portion, and during cooling the isothermal quality is consequently liable to deteriorate. With a heater module as given by the present invention, however, the heater part cools at a speed quite significantly faster than the speed of cooling through the lateral side, and especially with the heater module in the second aspect, because heat passes to the block part by means of thermal conduction the isothermal quality during cooling is enhanced by a wide margin. In concrete terms, by optimizing the heater—and block—part parameters, it is possible to obtain an isothermal rating during cooling of within ±1%.

Utilizing a heater module of the present invention as described above in CVD equipment employed in deposition of metal films as well as dielectric films, in etcher equipment employed in etching metal films as well as dielectric films, in coater/developer equipment employed in thermosetting of photoresists in photolithography, and in low-k dielectric baking devices employed in heating/baking of low-k films is especially efficacious owing to the effect of enhanced heater cooling speed.

What is more, semiconductor manufacturing equipment in which a heater module of the present invention is utilized is a means that can serve to heighten productivity and reduce costs, and by which improvement in both characteristics and performance of wafers and other processed articles is recognizable.

EMBODIMENTS

Embodiment 1

Sets of two disks 335 mm diameter and 10 mm thickness made of the ceramic materials set forth in the table below were prepared, and on the top face of one disk in each set a heating element was formed by tungsten metallization. Onto this ceramic disk the remaining ceramic disk in each set was overlaid, putting the heating element into a sandwich which was then hot-press joined using a hot press device, whereby ceramic heater parts were fabricated.

Block parts, made from each of the metal and ceramic materials set forth in the following table and having the same diameter as the foregoing heater parts, were also fabricated. In doing so, the percent heat capacity of the block part with respect to the total heat capacity of the heater and block parts was varied as indicated in the table below by varying the block part thickness. In addition, in all samples, the top face of the block part (the face where it abuts with the heater part) was surfaced by lapping.

Heater modules in the first aspect according to the present invention were assembled using these heater parts and block parts. That is, they were lent a structure in which during heating the heater part and the block part abut, and in which during cooling the block part is lowered to separate it from the heater part. It should be understood that elevation of the block part and its abutment onto/fixing against the heater part was by means of oil pressure or air pressure, and furthermore that with Sample 6 only, the heater part and the block part were held fast by vacuum-chucking. It should also be understood that the distance between the heater part and the block part separated during cooling was fixed at 200 mm with all of the samples.

Isothermal ratings for each of the sample heater modules having been heated (200° C.) were found by applying a 200-V voltage to the heater part in abutment with the block part and heating to 200° C., maintaining that temperature for 10 minutes, and then measuring the temperature at 9 points within the top face (wafer-carrying surface) of the heater module. After that the block part was lowered to separate it from the heater part, and the speed with which the isolated heater part, left to radiate heat, cooled down to 150° C. was measured. In doing so, isothermal ratings when cooled (150° C.) were found from the temperatures at the 9 points within the top face likewise as just noted. These results were tabulated and set forth in the following table.

TABLE

| Sample | Heater part material | Block part material | Percent heat capacity | Shifting & holding fast | Cooling speed (° C./min) | Isothermal rating (±%) | |
|---|---|---|---|---|---|---|---|
| | | | | | | When heated | When cooled |
| 1 | AlN | Al | 5 | Oil press. | 5 | 0.5 | 0.7 |
| 2 | AlN | Al | 15 | Oil press. | 7 | 0.5 | 0.7 |
| 3 | AlN | Al | 20 | Oil press. | 10 | 0.5 | 0.7 |

TABLE-continued

| Sample | Heater part material | Block part material | Percent heat capacity | Shifting & holding fast | Cooling speed (° C./min) | Isothermal rating (±%) When heated | Isothermal rating (±%) When cooled |
|---|---|---|---|---|---|---|---|
| 4 | AlN | Al | 100 | Oil press. | 25 | 0.5 | 0.7 |
| 5 | AlN | Al | 200 | Oil press. | 32 | 0.5 | 0.7 |
| 6 | AlN | Al | 100 | Vac. chuck. | 27 | 0.5 | 0.7 |
| 7 | AlN | Al | 100 | Air press. | 25 | 0.5 | 0.7 |
| 8 | SiC | Al | 100 | Oil press. | 23 | 0.6 | 0.8 |
| 9 | $Si_3N_4$ | Al | 100 | Oil press. | 26 | 0.9 | 0.95 |
| 10 | $Al_2O_3$ | Al | 100 | Oil press. | 21 | 0.9 | 0.95 |
| 11 | BN | Al | 100 | Oil press. | 33 | 0.4 | 0.6 |
| 12 | AlN | Mg | 100 | Oil press. | 22 | 0.5 | 0.7 |
| 13 | AlN | Cu | 100 | Oil press. | 28 | 0.5 | 0.7 |
| 14 | AlN | Fe | 100 | Oil press. | 20 | 0.5 | 0.7 |
| 15 | AlN | SUS | 100 | Oil press. | 18 | 0.5 | 0.7 |
| 16 | AlN | $Al_2O_3$ | 100 | Oil press. | 18 | 0.5 | 0.7 |
| 17 | AlN | AlN | 100 | Oil press. | 22 | 0.5 | 0.7 |
| 18 | AlN | $Si_3N_4$ | 100 | Oil press. | 18 | 0.5 | 0.7 |
| 19 | AlN | AlN | 100 | Oil press. | 23 | 0.5 | 0.7 |
| 20 | AlN | BN | 100 | Oil press. | 23 | 0.5 | 0.7 |

From the foregoing results, it is evident that with whichever of the samples as modules by the present invention high heater-cooling speeds of several °C./min or were obtained, and that isothermal ratings of within ±1% when heated and when were sustained. In particular, it is evident that by making the percent heat capacity block part 20% or less, extremely high heater-cooling speeds of 10° C./min or more achieved even as superior isothermal ratings are maintained.

COMPARATIVE EXAMPLE

An AlN heater part the same as that of the foregoing Embodiment 1 was prepared, and an air-cool cooling block, made of aluminum, having a 60 liter/min capacity was installed on the heater part, fixed on the reverse face thereof. It will be appreciated that a block part was not used in the comparative example. This heater that has been in use to date was heated to 200° C., which temperature was maintained for 10 minutes, and then was cooled down to 150° C. by means of the air-cool cooling block.

In that instance, isothermal rating when heated and when cooled (150° C.) was found in the same way as in Embodiment 1. The results were a heater cooling speed of 1° C./min, and an isothermal rating of ±1.5% when heated and ±1.7% when cooled, which was considerably inferior to that of the samples of the present invention in the foregoing Embodiment 1.

Embodiment 2

A heater module was assembled utilizing the same heater part and block part as with Sample 4 in the foregoing Embodiment 1, but the reverse face of the AlN-made heater part—i.e., the face where it abuts with the Al—made block part—was covered with a Cu layer 0.2 mm in thickness.

The same testing and evaluation as with Embodiment 1 were performed on this heater module, with the result being that the heater cooling speed and the isothermal rating were the same as with Sample 4 in Embodiment 1. With Sample 4 in Embodiment 1, however, at 500 cycles chips 0.1–0.2 mm in diameter appeared in the edge of the reverse face of the heater part, but with the present Embodiment 2 sample, no chips or like flaws were discernable at all.

Embodiment 3

A heater module was assembled utilizing the same heater part and block part as with Sample 4 in the foregoing Embodiment 1, but the top face of the Al-made block part—i.e., the face where it abuts with the AlN-made heater part—was finished to a specular surface by a polishing process.

The same testing and evaluation as with Embodiment 1 was performed on this heater module. Thanks to the top face of the block part having been made mirror-like, heat radiant from the heater part was reflected back, keeping the block part from absorbing the heat, and therefore even with the separation between the heater part and the block part curtailed to 50 mm, the same heater cooling speed and isothermal rating as with Sample 4 in Embodiment 1, where the heater part-block part separation was set at 200 mm, were obtained.

Embodiment 4

The heater module represented in FIG. 2, in the second aspect of the present invention, was assembled utilizing the same heater part and block part as with Sample 4 in the foregoing Embodiment 1, but the block part was installed to be shiftable up and down by means of oil pressure. That is, the heater module was lent a structure in which during heating the heater part and the block part are separated and the block part is brought into contact with, and rested on, the bottom part of the chamber, and during cooling, the block part is lifted to abut on the heater part. It should be understood that the remaining aspects of the heater module were exactly the same as with Sample 4 in Embodiment 1.

The isothermal rating of the heater part having been heated (200° C.) was found by heating it in isolation to 200° C., maintaining that temperature for 10 minutes, and thereafter measuring its temperature at 9 points within the top face. Subsequently, the block part was lifted to abut it on the heater part, the heater part was allowed to cool down to 150° C., and the cooling speed was measured and the isothermal rating when cooled (150° C.) was found.

The results were that the heater cooling speed and isothermal rating were the same as with Sample 4 in Embodiment 1. However, with the block part, which had been lowered until it contacted the chamber bottom part, cooled down to room temperature the time until preparation for the next cooling of the heater completed was shortened to ⅓ by comparison with Sample 4 in Embodiment 1.

Embodiment 5

The heater module represented in FIG. 3, in the second aspect of the present invention, was assembled utilizing the same heater part and block part as with Sample 4 in the foregoing Embodiment 1, but the heater part was installed to be shiftable up and down by means of oil pressure. That is, the heater module was lent a structure in which during heating the heater part and the block part are separated and the block part is brought into contact with, and rested on, the bottom part of the chamber, and during cooling, the heater part is lowered to abut on the block part. It should be understood that the remaining aspects of the heater module were exactly the same as with Sample 4 in Embodiment 1.

The isothermal rating of the heater part having been heated (200° C.) was found by heating it in isolation to 200° C., maintaining that temperature for 10 minutes, and thereafter measuring its temperature at 9 points within the top face. Subsequently, the heater part was lowered to abut it on the block part, the heater part was allowed to cool down to 150° C., and the cooling speed was measured and the isothermal rating when cooled (150° C.) was found.

The results were that the heater cooling speed and isothermal rating were the same as with Sample 4 in Embodiment 1. However, with the block part, resting on and in constant contact with the chamber bottom part, cooled down to room temperature the time until preparation for the next cooling of the heater completed was shortened to ⅓ by comparison with Sample 4 in Embodiment 1.

Embodiment 6

Heater modules identical with those of the foregoing Embodiment 4 and comparative example were installed into place within a low-k film baking device, and an actual-practice implementation was made in which a low-k film coated onto a 12-inch Si wafer was cured.

With the low-k film cured in the baking device utilizing the heater module of Embodiment 4, the low-k film adhesive strength improved 20% by comparison with the case with the baking device utilizing the heater module of the comparative example. In addition, the time for the heater to cool was curtailed to ½s by comparison with the comparative example.

INDUSTRIAL APPLICABILITY

As given by the present invention, for semiconductor manufacturing equipment a heater module may be rendered in which the cooling speed of the heater post-heating may be heightened several times or more, preferentially 10 times or more, than conventional, and that can contribute toward bettering and improving productivity. What is more, utilizing the heater module lets semiconductor manufacturing equipment be scaled down, and makes appreciable cost reduction possible.

What is claimed is:

1. A heater module for semiconductor manufacturing equipment, comprising:
   a heater part for controlled heating of a wafer placed on an obverse face thereof, the heater part stationary relative to a reaction chamber floor; and
   a block part installed in the heater module to be shiftable relative to said heater part, for varying heat capacity in total with said heater part by abutting on as well as separating from a reverse surface of said heater part.

2. A heater module for semiconductor manufacturing equipment as set forth in claim 1, wherein the heat capacity of said block part is not less than 20% of the total heat capacity of said heater part and said block part.

3. A method of operating a heater module for semiconductor manufacturing equipment as set forth in claim 1, comprising:
   bringing said block part into abutment with said heater part when the heater module is to heat; and
   moving said block part away from said heater part when the heater module is to be cooled, to quicken the speed with which said heater part cools.

4. A method of operating a heater module for semiconductor manufacturing equipment as set forth in claim 1, comprising:
   separating said block part from said heater part when the heater module is to heat; and
   moving said block part into abutment with said heater part for conducting heat into said block part when the heater module is to be cooled, to quicken the speed with which said heater part cools.

5. A method of operating a heater module for semiconductor manufacturing equipment as set forth in claim 1, the method comprising: bringing said block part into abutment with said heater part; and vacuum-chucking said block part to said heater part to fix said block part to said heater part.

6. A heater module for semiconductor manufacturing equipment as set forth in claim 1, wherein at least one of either of abutting surfaces along which said heater part and said block part abut on each other is planarized.

7. A heater module for semiconductor manufacturing equipment as set forth in claim 1, wherein said block part is affixed to a bottom part of a chamber in the semiconductor manufacturing equipment.

8. A heater module for semiconductor manufacturing equipment as set forth in claim 1, wherein said heater part is made of ceramic, and a heating element is formed therein.

9. A heater module for semiconductor manufacturing equipment as set forth in claim 8, wherein the ceramic is at least one selected from the group consisting of aluminum oxide, aluminum nitride, silicon nitride, silicon carbide, and boron nitride.

10. A heater module for semiconductor manufacturing equipment as set forth in claim 8, wherein said heater part is superficially covered with metal at least where said heater part abuts with said block part.

11. A heater module for semiconductor manufacturing equipment as set forth in claim 1, wherein said block part is at least one selected from the group consisting of aluminum, magnesium, copper, iron, stainless steel, aluminum oxide, aluminum nitride, silicon nitride, silicon carbide, and boron nitride.

12. A heater module for semiconductor manufacturing equipment as set forth in claim 1, wherein said block part is either identical or similar to said heater part in form, and said block part in diametrical dimension is within ±25% of said heater part in diametrical dimension.

13. A heater module for semiconductor manufacturing equipment as set forth in claim 1, wherein either said heater part or said block part is shifted relative to the other by means of oil pressure.

14. A heater module for semiconductor manufacturing equipment as set forth in claim 1, wherein the cooling speed of said heater part is 10° C./min or more.

15. A heater module for semiconductor manufacturing equipment as set forth in claim 1, wherein while a wafer set in place on said heater part is being cooled, the heater module has an isothermal rating that is within ±1%.

16. A heater module for semiconductor manufacturing equipment as set forth in claim 1, utilized in CVD equipment, etcher equipment, coater/developer equipment, or a low-k dielectric baking device.

17. Semiconductor manufacturing equipment having installed therein a heater module for semiconductor manufacturing equipment as set forth in claim 1.

18. A heater module for semiconductor manufacturing equipment as set forth in claim 1, wherein said block part is shiftable into abutment on a bottom part of a chamber in the semiconductor manufacturing equipment.

19. A heater module for semiconductor manufacturing equipment as set forth in claim 18, wherein the chamber bottom is water cooled.

20. A heater module for semiconductor manufacturing equipment as set forth in claim 1, wherein either said heater part or said block part is shifted relative to the other by means of air pressure.

* * * * *

UNITED STATES PATENT AND TRADEMARK OFFICE
CERTIFICATE OF CORRECTION

PATENT NO. : 7,145,106 B2  
APPLICATION NO. : 11/160856  
DATED : December 5, 2006  
INVENTOR(S) : Akira Kuibira and Hirohiko Nakata Page 1 of 1

It is certified that error appears in the above-identified patent and that said Letters Patent is hereby corrected as shown below:

On the title page, at item (63) under the heading Related U.S. Application Data, "Continuation of application No. 10/487,842, filed on Feb. 23, 2004, now Pat. No. 6,963,052" should read --Continuation of application No. 10/487,842, filed on Feb. 23, 2004, now Pat. No. 6,963,052, and which was the National Stage of International Application No. PCT/JP03/06239, filed on May 19, 2003, now expired--.

Signed and Sealed this  
Fifteenth Day of October, 2013

Teresa Stanek Rea  
*Deputy Director of the United States Patent and Trademark Office*